United States Patent [19]
Yao et al.

[11] Patent Number: 4,805,008
[45] Date of Patent: Feb. 14, 1989

[54] SEMICONDUCTOR DEVICE HAVING MOSFET AND DEEP POLYCRYSTALLINE SILICON REGION

[75] Inventors: Kenji Yao; Teruyoshi Mihara, both of Yokosuka, Japan

[73] Assignee: Nissan Motor Co., Ltd., Yokohama, Japan

[21] Appl. No.: 64,852

[22] Filed: Jun. 22, 1987

[30] Foreign Application Priority Data

Jun. 23, 1986 [JP] Japan ................. 61-144740

[51] Int. Cl.$^4$ ............... H01L 27/02; H01L 29/04
[52] U.S. Cl. ............................. 357/42; 357/59; 357/47; 357/48
[58] Field of Search ............. 357/42, 48, 59, 47, 357/68

[56] References Cited

U.S. PATENT DOCUMENTS

| | | | |
|---|---|---|---|
| 4,209,713 | 6/1980 | Satou et al. ............... | 307/200 B |
| 4,327,368 | 4/1982 | Uchida .................... | 357/42 |
| 4,477,310 | 10/1984 | Park et al. ............... | 357/42 |
| 4,513,309 | 4/1985 | Cricchi ................... | 357/42 |
| 4,574,467 | 3/1986 | Halfacre et al. .......... | 357/42 |
| 4,593,459 | 6/1986 | Poppert et al. ........... | 357/42 |
| 4,646,124 | 2/1987 | Zunino ................... | 357/42 |
| 4,647,957 | 3/1987 | Coquin et al. ............ | 357/42 |

FOREIGN PATENT DOCUMENTS

| | | | |
|---|---|---|---|
| 0132179 | 10/1979 | Japan ........... | 357/42 |
| 0104249 | 6/1982 | Japan ........... | 357/42 |
| 0010857 | 1/1983 | Japan ........... | 357/42 |
| 0074561 | 4/1985 | Japan ........... | 357/42 |

OTHER PUBLICATIONS

Kyomasu, et al, "Analysis of Latch-Up in CMOS IC," Denshi-Tsushin-Gakkai-Ronbunshi, '78/2 vol. J61-CN02, pp. 106-113.

Primary Examiner—Eugene R. Laroche
Assistant Examiner—Michael B. Shingleton
Attorney, Agent, or Firm—Foley & Lardner, Schwartz, Jeffery, Schwaab, Mack, Blumenthal & Evans

[57] ABSTRACT

A semiconductor device such as a CMOS is provided with highly doped polycrystalline silicon regions for preventing undesired operations of parasitic transistors. Each polycrystalline region is extended deeper from a top surface of the silicon chip than source and drain regions of MOS transistors. In a substrate region of each MOS, one polycrystalline region of the same conductivity type as the substrate region is formed near the source region, and connected with said source region so that the polycrystalline region is held equipotential with the source region.

19 Claims, 9 Drawing Sheets

SEMICONDUCTOR DEVICE HAVING MOSFET AND DEEP POLYCRYSTALLINE SILICON REGION

BACKGROUND OF THE INVENTION

The present invention relates to a semiconductor device having one or more MOSFETs (or insulated gate FETs), and more specifically to such a semiconductor device designed to prevent undesired operations of parasitic transistors.

Problems caused by parasitic transistors in conventional CMOS devices are illustrated in FIGS. 11–15, and described in detail later.

SUMMARY OF THE INVENTION

It is an object of the present invention to provide a semiconductor device which can prevent undesired operations of parasitic transistors without the necessity of increasing the area of a semiconductor chip.

According to the present invention, a semiconductor device comprises a first semiconductor substrate region of a first conductivity type, formed in a substrate body, a pair of first source and drain regions of a second conductivity type opposite to the first conductivity type, a first gate electrode, and a first highly doped polycrystalline silicon region. The first source and drain regions are formed in the first substrate region, and separated from each other by a channel portion of the first substrate region so that a first MOSFET is formed. The first gate electrode is formed above the channel portion, and separated from the channel portion by a first gate insulating layer. The highly doped polycrystalline silicon region is of the same conductivity type as the first substrate region, and is formed in the first substrate region. The polycrystalline silicon region is deeper than the first source and drain regions, and is connected with the first source region so that the first polycrystalline silicon region is held equipotential with the first source region.

DETAILED DESCRIPTION OF THE INVENTION

To facilitate understanding of the present invention, reference is made to three conventional CMOS devices shown in FIGS. 11–15.

Figure 11:
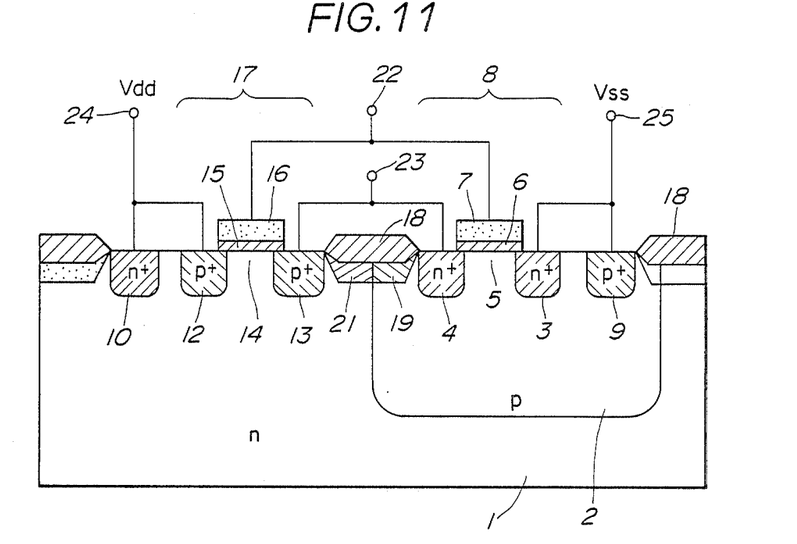
FIG. 11 is a vertical section showing a first conventional CMOS device.
Figure 12:
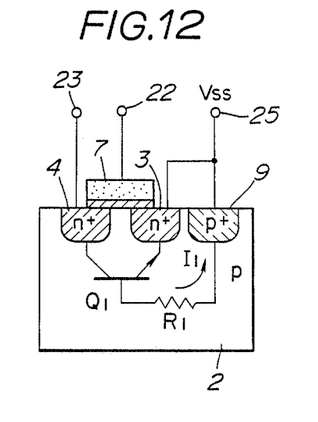
FIG. 12 is a vertical section for showing a parasitic transistor formed in a p well region of the conventional device of FIG. 11.
Figure 13:
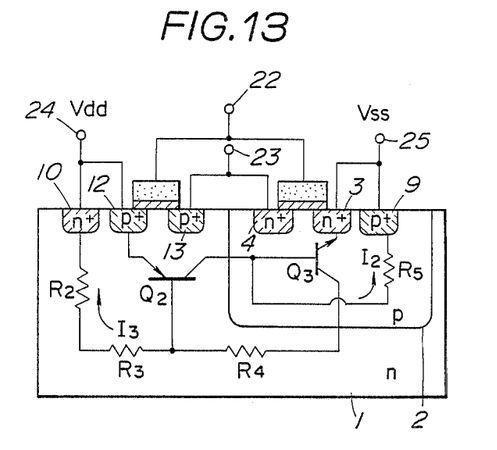
FIG. 13 is a vertical section for showing parasitic transistors formed between an n-type substrate and the p well region of the conventional device of FIG. 11.

A first conventional CMOS device is shown in FIGS. 11–13. The device of FIG. 11 includes an n-type Si semiconductor substrate 1, and a p-type well region 2 formed in a main surface of the substrate 1.

An n-channel MOSFET (nMOS) 8 is formed in the p well region 2. The nMOS 8 includes $n^+$-type source and drain regions 3 and 4 formed in the p well region 2, and a gate electrode 7. The gate electrode 7 is formed above a channel forming region 5 which is a part of the p well region 2, lying between the source and drain regions 3 and 4. The gate electrode 7 is separated from the channel forming region 5 by a gate insulating layer 6. A well contact region 9 of the $p^+$-type is further formed in the p well region 2. The p well region 2 including the channel forming region 5 serves as a substrate region of the nMOS 8.

A pMOS 17 is formed directly in the n-type substrate 1. The pMOS 17 includes $p^+$-type source and drain regions 12 and 13, and a gate electrode 16. The gate electrode 16 is formed above a channel forming region 14 which is a part of the n substrate 1, lying between the source and drain regions 12 and 13. The gate electrode 16 is separated from the channel forming region 14 by a gate insulating layer 15. A substrate contact region 10 of the $n^+$-type is further formed in the n substrate 1.

The device of FIG. 11 further includes a field insulating layer 18, a p-type region 19 and an n-type region 21. The p region 19 and the n region 21 are formed under the field insulating layer 18, for increasing a threshold voltage of a parasitic MOS for channel-cut.

The gate electrodes 7 and 16 of the nMOS 8 and the pMOS 17 are connected together to form an input terminal 22. The drain regions 4 and 13 are connected together to form an output terminal 23. A power supply terminal 24 of a supply voltage Vdd is connected to the source region 12 of the pMOS 17 and the substrate contact region 10. A low potential terminal 25 of a potential Vss is connected to the source region 3 of the nMOS 8 and the well contact region 9. In this way, the nMOS 8 and the pMOS 17 constitutes a CMOS inverter.

In the CMOS device having such a complicated structure, there are formed various parasitic bipolar transistors, as shown in FIGS. 12 and 13.

FIG. 12 shows a parasitic npn transistor $Q_1$ which is formed by the regions of the nMOS 8 in the p well region 2, and a base resistance $R_1$ of the parasitic transistor $Q_1$ which is formed by a resistance of the p well region 2.

When the voltage applied to the input terminal 22 of the CMOS inverter is equal to or lower than Vdd/2, then the pMOS 17 turns on, so that the supply voltage Vdd is applied to the drain region 4 of the nMOS 8. When the input voltage exceeds a level of about Vdd/2, the channel region 5 of the nMOS 8 is inverted, so that a current flows between the drain and source.

In this case, an electric field concentrates and a depletion region extends especially near the drain region 4, immediately below the gate electrode 7, so that carriers accelerated in this depletion region collide against the Si crystal lattice of the p well region 2, and create electron-hole pairs. The created electrons are absorbed into the drain region 4. However, the holes are injected into the p well region 2, flow through the base resistance $R_1$ and reach the well contact region 9. Therefore, the potential of the p well region 2 is increased, with respect to the source region 3, by $I_1R_1$, where $I_1$ is a current flowing through the base resistance $R_1$.

If the current $I_1$ is so increased that the potential of the p well region 2 becomes equal to or greater than a built-in potential between the n+ source region 3 and the p well region 2, then the pn junction between the p well region 2 and the n+ source region 3 is forward biased, so that a base current flows in the parasitic transistor $Q_1$.

As a result, the parasitic transistor $Q_1$ turns on, so that a large current flows between the collector and emitter of the transistor $Q_1$, that is, between the drain and source of the nMOS 8. This phenomenon, generally called "switch-back", is detrimental because it causes a decrease in drain-source withstand voltage of the nMOS 8.

FIG. 13 shows a parasitic pnp transistor $Q_2$ and a parasitic npn transistor $Q_3$ which both extend over both the n substrate 1 and the p well region 2.

The parasitic pnp transistor $Q_2$ is constituted by the p+ source region 12 of the pMOS 17 serving as an emitter, the n substrate 1 serving as a base, and p well region 2 serving as a collector. The npn transistor $Q_3$ has an emitter formed by the n+ source region 3 of the nMOS 8, a base formed by the p well region, and a collector formed by the n substrate 1. The transistors $Q_2$ and $Q_3$ are connected so as to form a pnpn thyristor structure. Resistances $R_2$–$R_5$ are formed by the n substrate 1 and the p well region 2, as shown in FIG. 13.

If a noise of positive polarity, having a voltage equal to or greater than the supply voltage Vdd enters through the output terminal 23, then the parasitic transistors $Q_2$ and $Q_3$ act as follows: The positive noise flows into the substrate regions through the drain regions 4 and 13. In this case, undesired effects are produced especially by holes injected from the p+ drain region 13 of the pMOS 17 into the n substrate 1.

A part of the injected holes diffuse in the n substrate 1, and disappear by recombining with electrons in the n substrate 1. However, a considerable amount of the holes reach the p well region 2 because the impurity concentration of the n substrate 1 is low. The higher the hole mobility $\mu_p$ of the n substrate 1 is, the more holes reach the p well region 2.

The holes which have reached the p well region 2 flow through the resistance $R_5$ into the well contact region 9 of the p+ type. In this case, the potential of the p well region 2 is increased by $I_2R_5$ resulting from multiplication between a current $I_2$ of the holes and the resistance $R_5$. If this increase of the potential exceeds a built-in potential between the n+ source region 3 of the nMOS 8 and the p well region 2, then the pn junction between the p well region 2 and the n+ source region 3 is forward biased, and the transistor $Q_3$ is turned on.

In this case, the collector current of the transistor $Q_3$ becomes a base current of the transistor $Q_2$, and therefore, the transistor $Q_2$ is also turned on. In turn, the collector current of the transistor $Q_2$ becomes the base current of the transistor $Q_3$. In this way, positive feedback is applied to the transistors $Q_2$ and $Q_3$.

When both transistors $Q_2$ and $Q_3$ are turned on, the thyristor structure formed by the pnp transistor $Q_2$ and the npn transistor $Q_3$ falls into a latch-up state, in which a large current flows between the supply terminal 24 and the low potential terminal 25. Once such a latch-up occurs, the device cannot be restored to the original state until the power supply is cut off.

When a noise of negative polarity enters the device through the output terminal 23, the parasitic transistors $Q_2$ and $Q_3$ are affected especially by electrons injected from the drain region 4 of the nMOS 8 into the P well region 2.

Although a part of the injected electrons disappear by recombining with holes in the p well region 2, most of the injected electrons diffuse through the p well region 2 and reach the n substrate region 1. The amount of the electrons reaching the substrate region 1 increases as the electron mobility $\mu_e$ in the p well region 2 increases. The electron mobility in the p well region is higher than the hole mobility in the n substrate region 1. Therefore, a very large amount of the electrons reach the n substrate region 1. In the n substrate region 1, the electrons pass through the resistances $R_2$ and $R_3$, and flow into the substrate contact region 10 of the n+ type. A current $I_3$ of these electrons decreases the potential of the n substrate region 1 with respect to the source region 12 of the pMOS 17 by $I_3(R_2+R_3)$. By this increase of the potential, the transistor $Q_2$ is turned on, and subsequently the transistor $Q_3$ is also turned on in the same manner as in the case of the positive noise.

In this way, an excessive current flows through the CMOS device when one or more of the various parasitic bipolar transistors are turned on by the action of the carriers injected into the substrate region 1 or the p well region. Such an excessive current tends to cause malfunctions of the CMOS, and even damages the device if a power dissipation due to this excessive current exceeds a permissible limit.

It is possible to prevent or restrain the parasitic bipolar transistors from turning on by employing any one or more of the following means. (i) To decrease the base resistances of the transistors $Q_2$ and $Q_3$ by increasing their base doping level. Decrease in the base resistances makes it difficult for the transistors $Q_2$ and $Q_3$ to turn on. (ii) To separate the p well region 2 from the source and drain regions 12 and 13 of the pMOS 17 as far as possible. (iii) To separate the n substrate region 1 from the source and drain regions 3 and 4 of the nMOS 8 by increasing the depth of the p well region 2.

Figure 14:
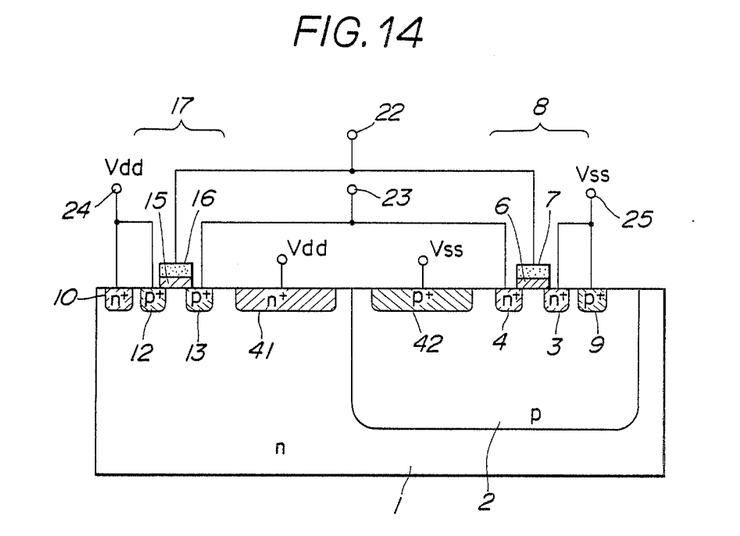
FIG. 14 is a vertical section showing a second conventional CMOS device.

FIG. 14 shows a second conventional example. A CMOS device of FIG. 14 is provided with an n+ contact region 41 and a p+ contact region 42. The n+ contact region 41 having a relatively large area is formed between the p well region 2 and the p+ drain region 13 of the pMOS 17. The supply voltage Vdd is applied to the n+ contact region 41. The p+ contact region 42 is formed in the p well region 2 at such a position that the region 42 is interposed between the nMOS 8 and the PMOS 17. The p+ contact region 42 is connected to the low potential terminal 25.

In this device, the p well region 2 is separated from the p+ regions 12 and 13 in the n substrate region by forming the n+ contact region 41. The base resistance of the transistor $Q_3$ is reduced by forming the p+ contact region 42.

When a positive noise occurs, holes are injected from the drain region 13 into the n substrate region 1 as in the device of FIG. 11. However, the contact region 41 of the second example increases the distance between the drain region 13 and the p well region 2, and this increase of the distance increases the probability of recombination between holes and electrons in the n substrate region 1 because the holes must travel a long distance in the n substrate region 1 in order to arrive at the p well region 2. Therefore, more holes disappear in the n substrate region 1 by recombining with electrons, and the amount of the holes reaching the p well region 2 is decreased.

The holes which have reached the p well region 2 increase the potential of the p well region 2 by flowing through the p well region 2. However, the potential increase of the p well region 2 is small because the base resistance corresponding to the resistance $R_5$ of FIG. 13 is decreased by the p+ contact region 42. Therefore, the structure of FIG. 14 can restrain the turn-on action of the parasitic transistor $Q_3$.

In the case of a negative noise, electrons are injected from the drain region 4 of the nMOS 8 into the p well region 2, and diffuse through the p well region 2 to the n substrate region 1. The electrons which have reached the n substrate region 1 decreases the potential of the n substrate region 1 by flowing through the n substrate region 1. In the device of FIG. 14, however, the potential decrease of the n substrate region 1 is small because the resistance corresponding to the resistances $R_2$ and $R_3$ of FIG. 13 is decreased by the n+ contact region 41. Therefore, the structure of FIG. 14 can restrain the turn-on action of the parasitic transistor $Q_2$.

However, the CMOS device of FIG. 14 is still unsatisfactory in that the chip size and cost are increased by formation of the broad n+ contact region 41 and the p+ contact region 42.

Figure 15:
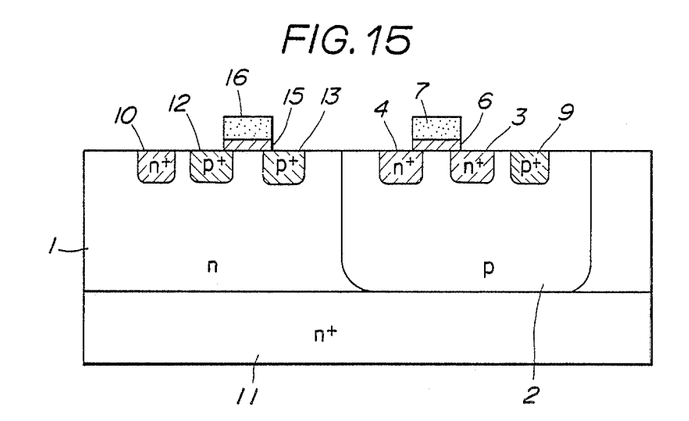
FIG. 15 is a vertical section showing a third conventional CMOS device.

FIG. 15 shows a third conventional example. A CMOS device of the third example uses a so called epitaxial substrate. As shown in FIG. 15, an n-type epitaxial layer 1 is grown on an n+-type original substrate 11, and used as an n-type substrate region 1 of a PMOS. A p well region 2 for an nMOS is formed in the epitaxial layer 1. In this device, the values of the resistances $R_3$ and $R_4$ shown in FIG. 13 are decreased by the highly doped n+ substrate 11. Therefore, the structure of the third example can decrease the potential change $I_3(R_2+R_3)$ of the n substrate region 1 which is caused by the electron current $I_3$ resulting from a negative noise entering the output terminal 23.

However, the structure of the third conventional example cannot sufficiently prevent the operations of the parasitic bipolar transistors $Q_1$, $Q_2$ and $Q_3$ because the resistance $R_1$ shown in FIG. 12, and the resistances $R_2$ and $R_3$ shown in FIG. 13 are not reduced. Besides, the cost is increased by the epitaxial process.

A first embodiment of the present invention is shown in FIGS. 1-4.

Figure 1:
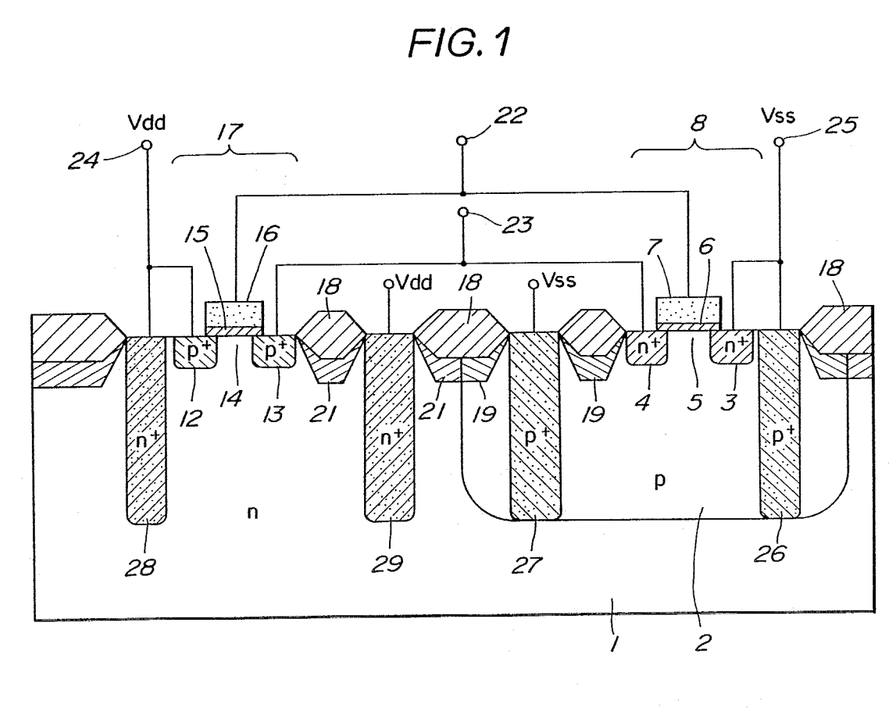
FIG. 1 is a vertical section showing a semiconductor device of a first embodiment of the present invention.

A device of the first embodiment shown in FIG. 1 is a COMS device, whose basic structure is not different from that of the conventional device of FIG. 11. An n-type Si substrate 1 of the device of FIG. 1 has a p well region 2 formed in a main surface of the substrate 1.

An nMOS 8 is formed in the p well region 2, and the p well region 2 serves as a substrate region of the nMOS 8. The nMOS 8 includes n+-type source and drain regions 3 and 4, which are both formed in the p well region 2. The source and drain regions 2 and 3 are separated by a channel region 5 which is a part of the p well region 2. A gate electrode 7 is formed above the channel region 5, and separated from the channel region 5 by a gate insulating layer 6.

A pMOS 17 is formed in the n substrate 1 in such a manner that the n substrate 1 serves as a substrate region of the pMOS 17. The pMOS 17 includes p+-type source and drain regions 12 and 13, formed in the n substrate 1, and a channel region 14 which is a part of the substrate 1 lying between the source and drain regions 12 and 13. A gate electrode 16 above the channel region 14 is insulated by a gate insulating layer 15.

The device of FIG. 1 further has a field insulating layer 18, and p semiconductor region 19 and n semiconductor region 21 which are formed under the field insulating layer 18 for channel-cut.

The CMOS device of FIG. 1 has a CMOS inverter structure. An input terminal 22 is connected to the gate electrodes 7 and 16 which are connected together, and an output terminal 23 is connected to the drain regions 4 and 13 which are connected together. A supply terminal 24 is connected to the source region 12 of the pMOS 17, and a low potential terminal 25 is connected to the source region 3 of the nMOS 8.

The device of the first embodiment is different from the conventional device of FIG. 11 in that there are further formed polycrystalline silicon regions 26-29.

The polycrystalline silicon regions 26 and 27 are formed in the p well region 2. The polycrystalline region 26 is located by the side of the source region 3 of the nMOS 8, and the polycrystalline region 27 is near the boundary between the pMOS 17 and the p well region 2. The source and drain regions 3 and 4 are formed between the polycrystalline regions 26 and 27, as shown in FIG. 1. The polycrystalline regions 26 and 27 extend downwardly from the top surface of the p well region 2, and are deeper than the source and drain regions 3 and 4 of the nMOS 8. Each of the polycrystalline region 26 and 27 is highly doped with impurities of the same conductivity type as the p well region 2. In this embodiment, the polycrystalline region 26 and 27 are the p+-type.

The polycrystalline region 26 near the source region 3 is connected with the source region 31, and the low potential Vss is applied to the polycrystalline region 26. Thus, the polycrystalline region 26 performs the contacting function in place of the well contact region 9 of FIG. 11. The low potential Vss is applied to the polycrystalline region 27 too.

The polycrystalline regions 28 and 29 are formed in the n substrate 1. The polycrystalline region 28 is by the side of the source region 12 of the pMOS 17, and the polycrystalline region 29 is near the p well region 2. The source and drain regions 12 and 13 of the pMOS 17 are formed between the polycrystalline regions 28 and 29, as shown in FIG. 1. The polycrystalline region 27 in the p well region 2 and the polycrystalline region 29 in the n substrate 1 are interposed between the nMOS 8 and the pMOS 17. Both the polycrystalline regions 28 and 29 extend downwardly from the top surface of the substrate 1, and are deeper than the source and drain regions 12 and 13. The polycrystalline regions 28 and 29 are highly doped with impurities of the same conductivity type as the substrate 1. In this embodiment, the substrate 1 is the n-type, and therefore the polycrystalline regions 28 and 29 are the n+-type.

The polycrystalline region 28 near the source region 12 is connected with the source region 12, and the supply voltage Vdd is applied to the polycrystalline region 28. Therefore, the polycrystalline region 28 performs the contacting function in place of the substrate contact region 10 of FIG. 11. The supply voltage Vdd is applied to the polycrysalline region 29 too.

FIGS. 2A-2H show, as an example, a process for fabricating the device of the first embodiment.

Figure 2A:
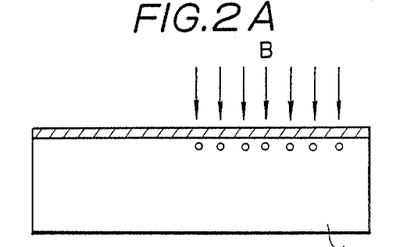
FIGS. 2A–2H are vertical sections for showing one example of a process of fabricating the device of FIG. 1.

At a step shown in FIG. 2A, an oxide layer for protection is formed on the main surface of the n substrate 1, and then boron ions are implanted in an area in which the p well region 2 is to be formed.

Figure 2B:
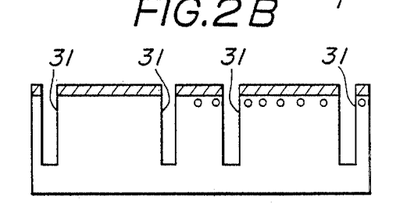

At a next step shown in FIG. 2B, deep depressions 31 are bored in the substrate 1 at predetermined positions to form the polycrystalline silicon regions 26-29, by the known RIE (Reactive Ion Etching) method.

Figure 2C:
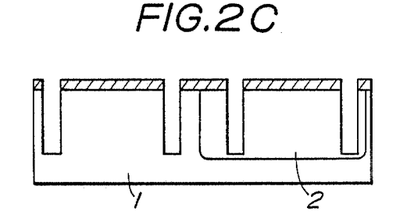

FIG. 2C shows a step of a heat treatment by which the p well region 2 is formed by diffusion of the implated boron impurity.

Figure 2D:
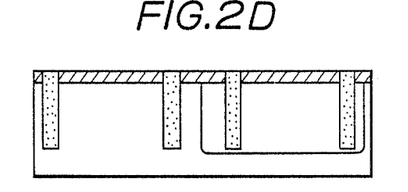

At a step of FIG. 2D, polycrystalline silicon is deposited in the deep depressions 31 by the CVD (Chemical Vapor Deposition) method.

Figure 2E:
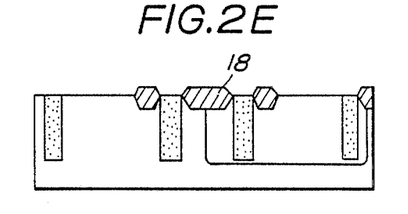

At a step of FIG. 2E, the field insulating oxide layer 18 is formed outside the areas to form the nMOS 8 and the pMOS 17.

Figure 2F:
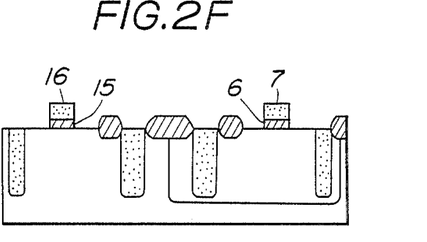

At a step of FIG. 2F, the gate insulating oxide layers 6 and 15, and the gate electrodes 7 and 16 are formed.

Figure 2G:
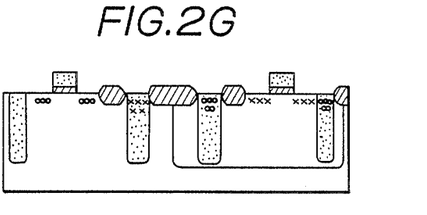

At a step of FIG. 2G, the n-type impurity such as phosphorus (P) or arsenic (As) is ion implanted at positions to form the source and drain regions 3 and 4 of the nMOS 8, and the polycrystalline regions 28 and 29 in the n substrate 1, and the p-type impurity such as boron (B) is ion implated at positions to form the source and drain regions 12 and 13 of the pMOS 17, and the polycrystalline regions 26 and 27 in the p well region 2.

Figure 2H:
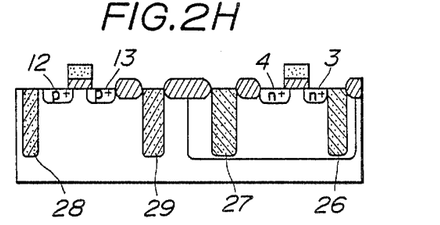

Finally, at a step of FIG. 2H, the source and drain regions 3 and 4 of the nMOS 8, the source and drain regions 12 and 13 of the pMOS 17, and the polycrystalline regions 26-29 are formed by a heat treatment for diffusing the ion implanted impurities.

The diffusion coefficient of an impurity is much higher in the polycrystalline silicon than in the single crystal silicon. Therefore, it is easy to diffuse the impurity atoms deep into the polycrystalline regions before the diffusion in the lateral direction proceeds.

Figure 3:
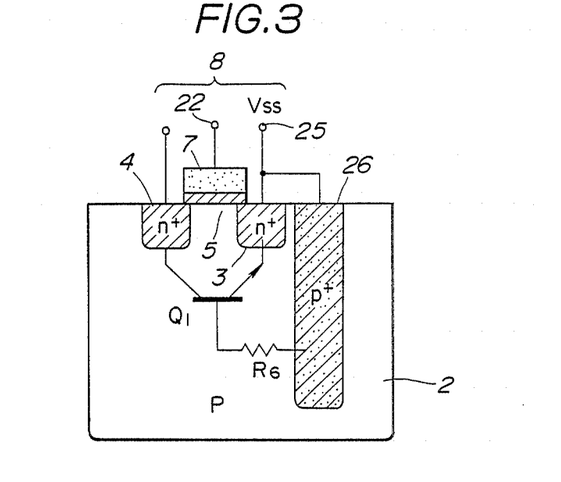
FIG. 3 is a vertical section for showing a parasitic transistor formed in a p well region of the device of FIG. 1.
Figure 4:
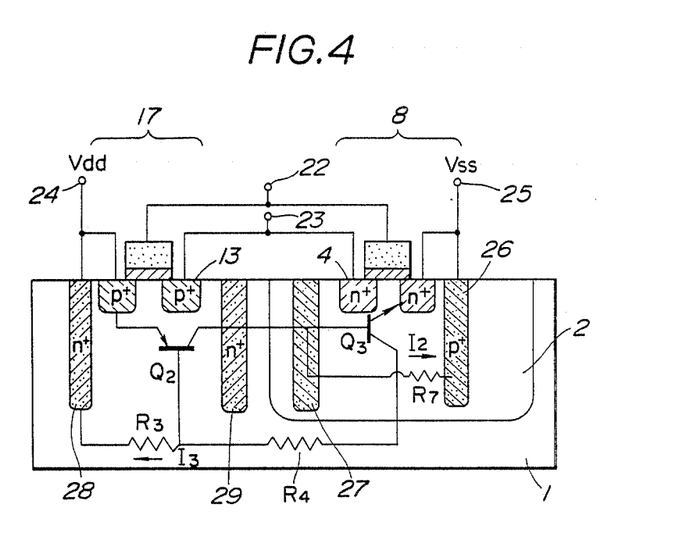
FIG. 4 is a vertical section for showing parasitic transistors formed between an n-type substrate region and the p well region of the device of FIG. 1.

FIGS. 3 and 4 show operations of the first embodiment device.

A parasitic npn transistor $Q_1$ similar to one shown in FIG. 12 is formed in the p well region 2 of the first embodiment device too. However, a base resistance $R_6$ of the parasitic transistor $Q_1$ is very low as compared with the base resistance $R_1$ of the conventional device of FIG. 12 because there is formed the highly doped polycrystalline silicon region 26 extending deeper than the n+ source region 3.

When the channel region 5 is inverted by application of a required positive voltage to the gate electrode 7, and a current flows between the drain and source regions 4 and 3, then the depletion region extends near the drain region 4 immediately below the gate electrode 7 by concentration of the electric field, and electron-hole pairs are generated by collision of carriers accelerated in the depletion region against the Si crystal lattice of the p well region 2.

While the electrons of the generated pairs are absorbed by the drain region 4, the holes are injected into the p well region 2, and flow through the base resistance $R_6$ into the polycrystalline silicon region 26 which has the function of the well contact region too. Therefore, the current $I_1$ of these holes flowing through the resistance $R_6$ increases the potential of the p well region 2 with respect to the source region 3 by $I_1R_6$. In the first embodiment device, however, this potential increase $I_1R_6$ is very small because the base resistance $R_6$ is reduced by formation of the polycrystalline silicon region 26. By reducing the potential increase $I_1R_6$, the structure of the first embodiment device can prevent the parasitic transistor $Q_1$ from turning on, and prevent the drain-source withstand voltage of the nMOS 8 from being decreased by the switch-back phenomenon.

In order to reduce the base resistance $R_6$, it is very helpful to make the polycrystalline region 26 deep because a larger quantity of the holes are injected downwardly toward the bottom of the p well region 2.

FIG. 4 shows a parasitic pnp transistor $Q_2$ and a parasitic npn transistor $Q_3$, which are formed in the first embodiment device in the same manner as the parasitic transistors $Q_2$ and $Q_3$ formed in the conventional device shown in FIG. 13. However, the polycrystalline silicon regions 26-29 of the first embodiment repress the undesired operations of the parasitic transistors $Q_2$ and $Q_3$ in the following manner.

First, the polycrystalline silicon regions 27 and 29 lying between the nMOS 8 and the pMOS 17 prevent the minority carriers from moving from the p well region 2 to the n substrate 1 and vice versa, and therefore decrease the hole current $I_2$ in the p well region 2 and the electron current $I_3$ in the n substrate 1.

Because, in the polycrystalline silicon, many electrons of silicon atoms remain unused for covalent bonding, the mobility of the minority carriers in the polycrystalline silicon is equal to or less than about 1/10 of that in the single crystal silicon. Therefore, the n+ polycrystalline silicon region 29 traps the holes injected from the p+ drain region 13 of the pMOS 17 into the n substrate 1 by a positive noise, before they reach the p well region 2. The p+ polycrystalline silicon region 27 traps the electrons injected from the n+ drain region 4 of the nMOS 8 into the p well region 2 by a negative noise, before they reach the n substrate 1. In this way, the polycrystalline silicon regions 27 and 29 significantly reduce the hole current $I_2$ in the p well region 2 and the electron current $I_3$ in the n substrate 1, and by so doing prevent the parasitic transistors $Q_2$ and $Q_3$ from turning on.

Secondly, the polycrystalline silicon region 26 near the n+ source region 3 of the nMOS 8 decreases the base resistance $R_7$ of the transistor $Q_3$, and the polycrystalline silicon region 28 near the p+ source region 12 of the pMOS 17 decreases the base resistance of the transistors $Q_2$. The base resistance of the transistor $Q_2$ becomes approximately equal to R3 whereas that of the conventional device is equal to $R_2+R_3$ as shown in FIG. 13.

Reduction of the hole current $I_2$ in the p well region 2 and the electron current $I_3$ in the n substrate 1, and reduction of the base resistances of the parasitic transistors $Q_2$ and $Q_3$ are both effective for reducing the potential variation of the p well region 2 and the n substrate 1 and preventing the transistors $Q_2$ and $Q_3$ from turning on, so that a remarkable total effect can be obtained in preventing latch-up of the CMOS.

A second embodiment of the present invention is shown in FIGS. 5, 6 and 7A–7F. A CMOS device of the second embodiment is characterized by polycrystalline silicon regions 32 and 33. The polycrystalline silicon regions 32 and 33 are formed in the boundary of the p well region 2, and used also as isolation walls. The field insulating oxide layer 18 is formed on the polycrystalline regions 32 and 33.

FIGS. 7A–7F show one example of a process for fabricating the device of the second embodiment.

Figure 7A:
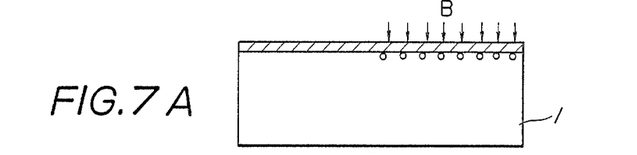
FIGS. 7A–7F are vertical sections for showing one example of a process of fabricating the device of the second embodiment.

At a step 7A, an oxide film for protection is formed on the main surface of the n substrate 1, and then boron ions are implanted in an area to form the p well region 2.

Figure 7B:
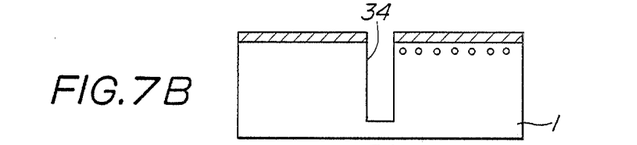
Figure 7C:
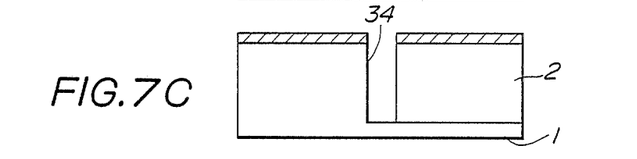
Figure 7D:
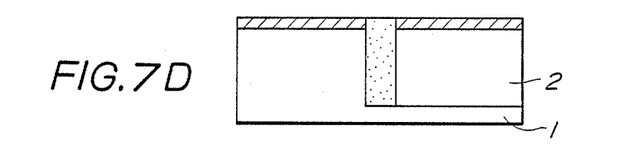

At a step of FIG. 7B, deep depression 34 are formed by RIE. At a step of FIG. 7C, the p well region 2 is formed by diffusing the implanted boron atoms by a heat treatment. At this step, the deep depressions 34 prevent the diffusion of the p well region 2 in the lateral direction, and forms the boundary of the p well region 2. At a step of FIG. 7D, polycrystalline silicon is deposited in the depressions 34 by CVD. At a step of FIG. 7E, boron and phosporus are ion implanted to form the p region and n region for channel-cut. At a step of FIG. 7F, the field insulating oxide layer 18 is formed on the polycrystalline regions 32 and 33 by thermal oxidation. The rate of oxidation of the polycrystalline silicon is higher than that of the single crystal silicon. Therefore, it is possible to form the field oxide layer 18 of a required thickness at a lower temperature within a shorter time as compared with the step of forming the field oxide layer 8 on the n substrate 1. Thereafter, the nMOS 8 and the pMOS 17 are formed in the p well region 2 and the n substrate 1.

Figure 5:
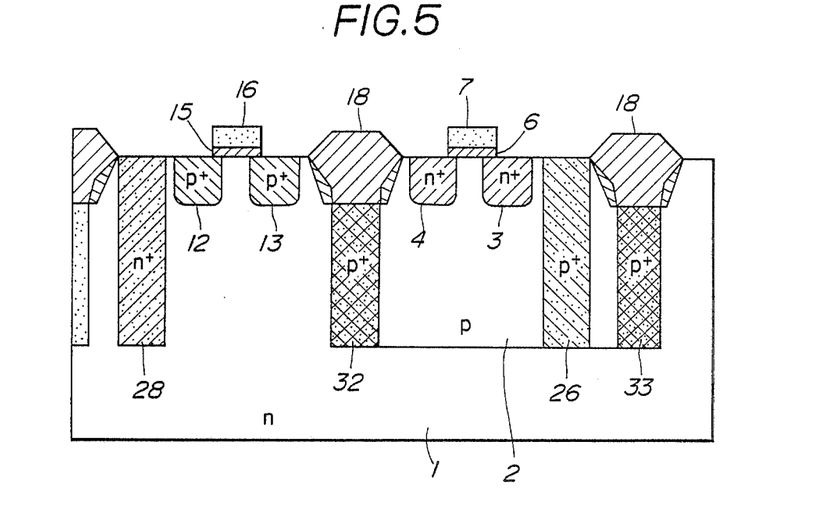
FIG. 5 is a vertical section showing a semiconductor device of a second embodiment of the present invention.

Like the polycrystalline region 27 of the first embodiment, the polycrystalline silicon region 32 of the second embodiment serves as a trap for catching the minority carriers in the p well region 2 and the n substrate 1, and prevents latch-up of the CMOS.

Figure 6:
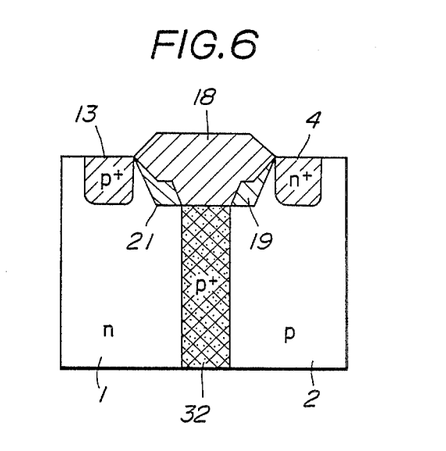
FIG. 6 is a vertical section of the device of FIG. 5 for showing a parasitic MOS.

As shown in FIG. 6, the polycrystalline silicon region 32 of the second embodiment occupies a channel region of a parasitic n-channel MOS which is formed under the field oxide layer 18. In general, a MOSFET formed by a polycrystalline silicon exhibits a higher threshold voltage than that of a MOSFET of a single crystal silicon even when the impurity concentration of the substrate region is the same. Therefore, the structure of the second embodiment can increase the threshold voltage of the parasitic MOS, and improve the effect of channel-cut. Alternatively, it is possible to decrease the impurity concentrations of the p and n regions 19 and 21 for channel-cut when the threshold voltage of the parasitic MOS need not be increased.

The withstand voltage between each drain region and the substrate region or the p well region is determined by the withstand voltage between the drain region and the channel cut region. Therefore, the structure of the second embodiment can increase the withstand voltage between each drain region 4 or 13 and the n substrate region 1 or the p well region 2.

In the fabrication process of FIGS. 7A–7F, the deep depressions 34 limit the lateral diffusion of the p well region 2, and therefore makes it possible to further miniaturize the pattern of the device.

According to the second embodiment, it is possible to prevent the undesired operations of the parasitic transistors $Q_1$, $Q_2$ and $Q_3$, to increase the drain withstand voltage, and to further miniaturize the device.

Figure 8:
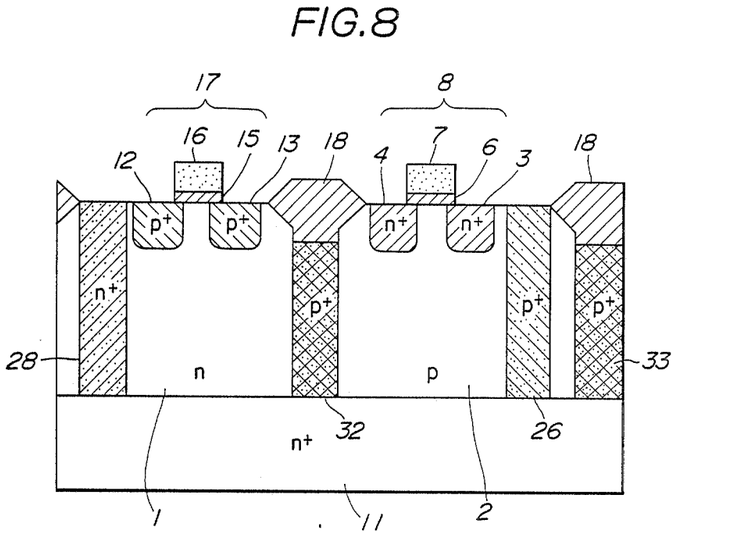
FIG. 8 is a vertical section showing a semiconductor device of a third embodiment of the present invention.

A third embodiment of the present invention is shown in FIG. 8. A CMOS device of the third embodiment is different from the device of the second embodiment in that the device of the third embodiment employs an epitaxial substrate including an n-type epitaxial layer 1 grown on a highly doped n+ original substrate 11.

The pMOS 17 is formed in the n epitaxial layer 1, and the epitaxial layer 1 is used as a substrate region of the pMOS 17. The p well region 2 for the nMOS 8 is also formed in the n epitaxial layer 1.

The highly doped polycrystalline silicon regions 26 and 28 are formed in the same manner as in the first embodiment, and the highly doped polycrystalline silicon regions 32 and 33 are formed in the boundary of the p well region 2 in the same manner as in the second embodiment. Each of the polycrystalline regions 26, 28, 32 and 33 is extended deep and reaches the underlying n+ substrate layer 11.

In the third embodiment, the resistances $R_3$, $R_4$ and $R_7$ shown in FIG. 4 are reduced because of the n+ substrate 11. Therefore, the structure of the third embodiment can prevent the operations of the parasitic bipolar transistors $Q_2$ and $Q_3$ more reliably by further reducing changes in the potentials of the p well region 2 and the n substrate region 1 of the pMOS 17 due to the holes injected from the p+ drain region 13 of the pMOS 17 into the n substrate region 1 and the electrons injected from the drain n+ drain region 4 of the nMOS 8 into the p well region 2.

A fourth embodiment of the present invention is shown in FIG. 9 and 10A–10D. A CMOS device of the fourth embodiment is substantially identical in structure and operation to the device of the third embodiment. However it is possible to fabricate the device of the fourth embodiment by a simpler process.

Figure 9:
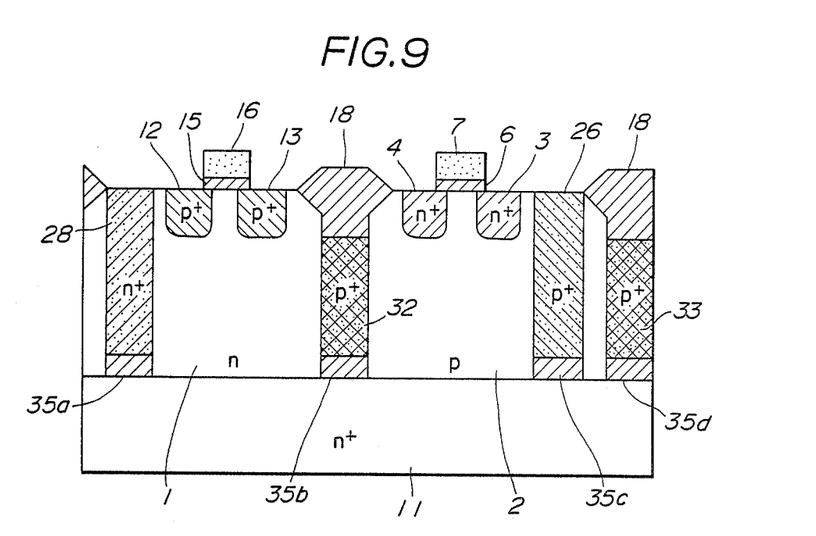
FIG. 9 is a vertical section showing a semiconductor device of a fourth embodiment of the present invention.

As shown in FIG. 9, the CMOS device of the fourth embodiment is characterized by underlying insulating oxide layers 35a, 35b, 35c and 35d, which are formed, respectively, under the polycrystalline silicon regions 28, 32, 26 and 33. The polycrystalline silicon regions 28, 32, 26 and 33 are formed, respectively, on the underlying oxide layers 35a–35d simultaneously with the n epitaxial layer 1 by the step of epitaxial growth.

FIGS. 10A–10D shows one example of a fabrication process for the CMOS device of the fourth embodiment.

Figure 10A:
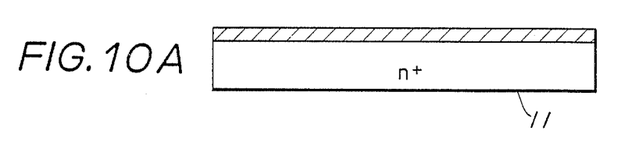
FIGS. 10A–10D are vertical sections for showing one example of a process of fabricating the device of FIG. 9.
Figure 10B:
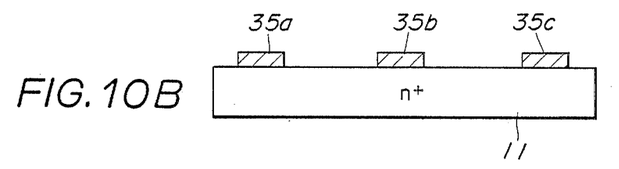

At a step of FIG. 10A, an oxide film is formed on the n+ original substrate 11. At a step of 10B, the underlying oxide layers 35a–35d are formed at predetermined positions by patterning the oxide film on the substrate 11 by the photoetching method.

Figure 10C:
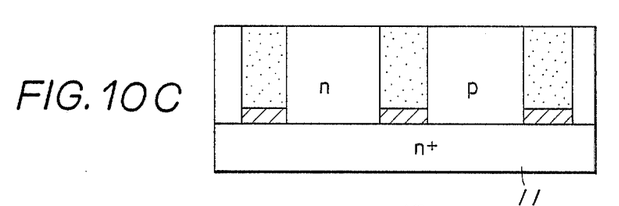

At a step of FIG. 10C, the n epitaxial layer is grown on the n+ substrate 11. During this epitaxial growth, the single crystal epitaxial layer is grown only on the bare surface of the substrate 11, and the polycrystalline silicon regions are grown on the underlying oxide layers 35a–35d because the crystal structure of the epitaxial layer is strongly dependent on the surface condition of the substrate.

Figure 7E:
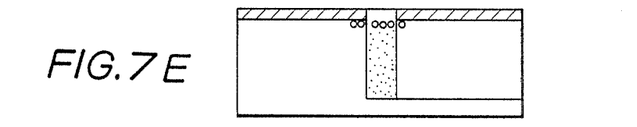
Figure 7F:
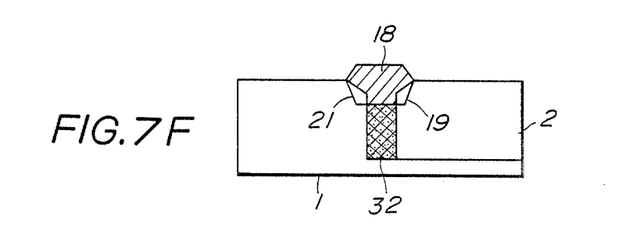
Figure 10D:
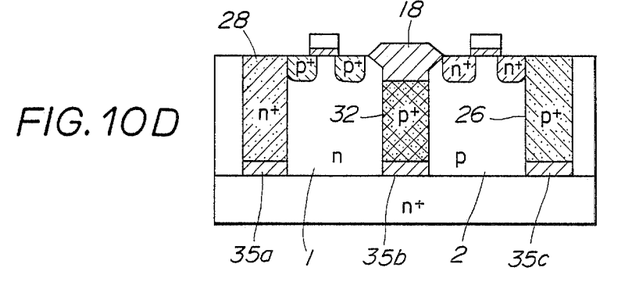

At a step of FIG. 10D, the field insulating layer 18, the nMOS 8 and the pMOS 17 are formed in the same manner as the steps shown in FIGS. 7E and 7F.

The underlying oxide layers 35a–35d of the fourth embodiment are very thin. Therefore, the structure of the fourth embodiment can prevent the undesired operations of the parasitic bipolar transistors $Q_2$ and $Q_3$ in the same manner as in the third embodiment.

In the fourth embodiment, the step for boring the depressions from the top of the semiconductor substrate is eliminated, and the polycrystalline silicon regions are formed by the simplified process.

The polycrystalline regions of the present invention are extended deep in the vertical direction of the substrate. Therefore, the structures of the present invention do not require substantial increase of the chip size.

What is claimed is:

1. A semiconductor device comprising:
   a first semiconductor substrate region of a first conductivity type, formed in a substrate body,
   a pair of first source and drain regions of a second conductivity type opposite to said first conductivity type, said first source and drain regions being formed in said first substrate region, and separated from each other by a channel portion of said first substrate region to form a first MOSFET,
   a first gate electrode formed above said channel portion of said first substrate region, and insulated from said channel portion by a first gate insulating layer, and
   a first highly doped polycrystalline silicon region which is the same conductivity type as said first substrate region, and is formed in said first substrate region so that said first polycrystalline silicon region is in contact with said first substrate region, said first polycrystalline silicon region being deeper than said first source and drain regions, and being connected with said first source region to hold said first polycrystalline silicon region equipotential with said source region.

2. A semiconductor device according to claim 1 wherein said first polycrystalline silicon region is located near said first source region.

3. A semiconductor device according to claim 2 further comprising:
   a second semiconductor substrate region of said second conductivity type, one of said first and second substrate regions being formed monolithically in the other of said first and second substrate regions within said substrate body,
   a pair of second source and drain regions of said first conductivity type, formed in said second substrate region, and separated from each other by a channel portion of said second substrate region to form a second MOSFET,
   a second gate electrode formed above said channel portion of said second substrate region and insulated from said second substrate region by a second gate insulating layer,
   a second highly doped polycrystalline silicon region which is the same conductivity type as said second substrate region and is formed in said second substrate region near second source region, said second polycrystalline region being deeper than said second source and drain regions and being connected with said second source region so that said second polycrystalline region is held equipotential with said second source region.

4. A semiconductor device according to claim 3 further comprising:
   a third highly doped polycrystalline silicon region which is the same conductivity type as said first substrate region and is formed in said first substrate region, said third polycrystalline region being located between said first and second MOSFETs, and said first source and drain regions being located between said first and third polycrystalline silicon regions, said third polycrystalline silicon region being deeper than said first source and drain regions, and connected with said first source region so that said third polycrystalline silicon region is held equipotential with said first source region, and
   a fourth highly doped polycrystalline silicon region which is the same conductivity type as said second substrate region and is formed in said second substrate region, said fourth polycrystalline region being deeper than said second source and drain regions and connected with said second source region so that said fourth polycrystalline silicon region is held equipotential with said second source region, said second source and drain region being located between said second and fourth polycrystalline silicon regions, said fourth polycrystalline silicon region being located between said first and second MOSFETs.

5. A semiconductor device according to claim 4 wherein said first conductivity type is ah n-type, said second conductivity type is a p-type, and said second substrate region is formed in said first substrate region.

6. A semiconductor device according to claim 5 wherein said substrate body has depressions, and each of said polycrystalline silicon regions is formed by depositing polycrystalline silicon in one of said depressions.

7. A semiconductor device according to claim 3 further comprising a third highly doped polycrystalline silicon region formed between said first and second substrate regions, said third polycrystalline silicon region being deeper than said first source and drain regions and said second source and drain regions.

8. A semiconductor device according to claim 7 wherein a top end of said third polycrystalline silicon region is covered with a field insulating oxide layer.

9. A semiconductor device according to claim 8 wherein said first conductivity type is an n-type, said second conductivity type is a p-type, said second substrate region is formed in said first substrate region, and said third polycrystalline silicon region is said second conductivity type.

10. A semiconductor device according to claim 9 wherein said third polycrystalline silicon region is located between said first and second drain regions of said first and second MOSFETs.

11. A semiconductor device according to claim 10 further comprising a fourth highly doped polycrystalline silicon region formed between said first and second substrate regions, said fourth polycrystalline silicon region being deeper than said second source and drain regions, said second source and drain regions being located between said third and fourth polycrystalline silicon regions.

12. A semiconductor device according to claim 11 wherein said substrate body has depressions, and said third and fourth polycrystalline silicon regions are formed by first boring said depressions in said first substrate region, then forming said second substrate region between said depressions, and finally depositing polycrystalline silicon in said depressions.

13. A semiconductor device according to claim 3 further comprising a highly doped semiconductor underlying substrate layer on which said first and second substrate regions are formed.

14. A semiconductor device according to claim 13 wherein said first substrate region is an epitaxial layer grown on said underlying layer, and said second substrate region is formed in said first substrate region.

15. A semiconductor device according to claim 14 further comprising a third highly doped polycrystalline silicon region formed between said first and second substrate regions.

16. A semiconductor device according to claim 15 wherein each of said polycrystalline silicon region reaches said underlying substrate layer.

17. A semiconductor device according to claim 15 wherein an underlying oxide film is formed between a bottom end of each of said polycrystalline silicon regions and said underlying substrate layer.

18. A semiconductor device according to claim 17 wherein each of said polycrystalline silicon regions has such shape and structure that each of said polycrystalline regions grows upwardly from a substantially entire surface of said underlying oxide film, and each of said polycrystalline silicon regions is formed by growing a polycrystalline structure on said underlying oxide film formed on said underlying substrate layer by a step for growing said epitaxial layer on said underlying substrate layer.

19. A semiconductor device according to claim 1 wherein said first polycrystalline region has an impurity concentration higher than that of said first substrate region.

* * * * *